US011757422B2

(12) United States Patent
Malladi et al.

(10) Patent No.: US 11,757,422 B2
(45) Date of Patent: Sep. 12, 2023

(54) QUADRATURE HYBRID WITH VARIABLE CAPACITOR TUNING NETWORK

(71) Applicant: NXP USA, Inc., Austin, TX (US)

(72) Inventors: Venkata Naga Koushik Malladi, Chandler, AZ (US); Joseph Staudinger, Gilbert, AZ (US)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 17/497,658

(22) Filed: Oct. 8, 2021

(65) Prior Publication Data

US 2023/0115944 A1    Apr. 13, 2023

(51) Int. Cl.
*H03H 7/01*      (2006.01)
*H01P 5/22*      (2006.01)

(52) U.S. Cl.
CPC .......... *H03H 7/0115* (2013.01); *H01P 5/227* (2013.01)

(58) Field of Classification Search
CPC .............................. H03H 7/0115; H01P 5/227
USPC ................... 333/117, 118, 175, 185
See application file for complete search history.

(56) References Cited

U.S. PATENT DOCUMENTS

| 8,704,575 B2 | 4/2014 | Hur et al. | |
| 2016/0099820 A1* | 4/2016 | Chakrabarti | H04L 27/00 375/232 |

| 2017/0163235 A1 | 6/2017 | Zhou et al. |
| 2018/0358676 A1 | 12/2018 | Laighton et al. |
| 2020/0014338 A1 | 1/2020 | Datta et al. |

OTHER PUBLICATIONS

Chiang, Yi-Chyun et al. "Design of a Wide-Band Lumped-Element 3-dB Quadrature Coupler", IEEE Transactions on Microwave Theory and Techniques, vol. 49, No. 3, Mar. 2001, pp. 476-479.
Hou, Jian-An et al. "A Compact Quadrature Hybrid Based on High-Pass and Low-Pass Lumped Elements", IEEE Microwave and Wireless Components Letters, vol. 17, No. 8, Aug. 2007, pp. 595-597.
Hsieh, Hsieh-Hung et al. "A Compact Quadrature Hybrid MMIC Using CMOS Active Inductors", IEEE Transactions on Microwave Theory and Techniques, vol. 55, No. 6, Jun. 2007, 8 pgs.
Scheeler, Robert et al. "GaAs MMIC Tunable Directions Coupler", IEEE, (2012), 3 pgs.
Tung, Wei-Shin et al. "Design of Microwave Wide-Band Quadrature Hybrid Using Planar Transformer Coupling Method", IEEE Transactions on Microwave Theory and Techniques, vol. 51, No. 7, Jul. 2003, 6 pgs.

* cited by examiner

*Primary Examiner* — Rakesh B Patel

(57) ABSTRACT

Embodiments of a method and an apparatus for a quadrature hybrid are disclosed. In an embodiment, a quadrature hybrid includes a first port, a second port, a third port, a fourth port, first, second, and third inductors, first, second, third, and fourth capacitors, and a first variable capacitor tuning network connected between the first port and the fourth port, and a second variable capacitor tuning network connected between the second port and the third port.

16 Claims, 9 Drawing Sheets

QUADRATURE HYBRID WITH VARIABLE CAPACITOR TUNING NETWORK

BACKGROUND

In wireless communication systems, a quadrature hybrid may be implemented in Power Amplifier (PA) Modules (PAMs) to manage the power of radio frequency (RF) signals. In a quadrature hybrid, a coupling factor may determine a ratio of power transferred via an RF signal received at an input port to a coupled port. As an example, the coupling factor may be determined by certain capacitive elements and inductive elements included in the quadrature hybrid. However, because such capacitive elements and inductive elements have fixed capacitance and inductance values, respectively, within the quadrature hybrid, the coupling factor of conventional quadrature hybrids is not adjustable to achieve different power transfer ratios.

SUMMARY

Embodiments of a method and an apparatus for a quadrature hybrid are disclosed. In an embodiment, a quadrature hybrid includes a first port, a second port, a third port, a fourth port, first, second, and third inductors, first, second, third, and fourth capacitors, and a first variable capacitor tuning network connected between the first port and the fourth port, and a second variable capacitor tuning network connected between the second port and the third port.

In an embodiment, the first and second capacitors are coupled in series between the first port and the fourth port, with a first intermediate node between the first and second capacitors, the third and fourth capacitors are coupled in series between the second port and the third port, with a second intermediate node between the third and fourth capacitors, the first inductor is coupled between the first port and the second port, the second inductor is coupled between the first intermediate node and the second intermediate node, and the third inductor is coupled between the fourth port and the third port.

In an embodiment, the first variable capacitor tuning network includes a first non-linear reactance component, and the second variable capacitor tuning network includes a second non-linear reactance component.

In an embodiment, the first non-linear reactance component is controlled with a first bias voltage, and the second non-linear reactance component is controlled with a second bias voltage.

In an embodiment, the first variable capacitor tuning network includes a first capacitor and a first switch, and the second variable capacitor tuning network includes a second capacitor and a second switch.

In an embodiment, at least one of the first capacitor and the first switch, and the second capacitor and the second switch are connected in parallel.

In an embodiment, at least one of the first capacitor and the first switch, and the second capacitor and the second switch are connected in series.

In an embodiment, the first variable capacitor tuning network includes a first capacitor and a first switch, and the second variable capacitor tuning network includes a second capacitor and a second switch, and where the first capacitor and the first switch are connected in at least one in series and in parallel, and the second capacitor and the second switch are connected in at least one of in series and in parallel.

In an embodiment, the first variable capacitor tuning network and the second variable capacitor tuning network have a symmetric arrangement of capacitors and switches.

In an embodiment, the first variable capacitor tuning network and the second variable capacitor tuning network have an asymmetric arrangement of capacitors and switches.

In an embodiment, the first variable capacitor tuning network and the second variable capacitor tuning network tune a coupling factor of the quadrature hybrid.

In an embodiment, the first variable capacitor tuning network includes a first plurality of capacitors and switches to provide a first tunable capacitance, and the second variable capacitor tuning network includes a second plurality of capacitors and switches to provide a second tunable capacitance.

An embodiment of an integrated circuit (IC) is also disclosed. The IC includes a quadrature hybrid including a first port, a second port, a third port, a fourth port, first, second, and third inductors, first, second, third, and fourth capacitors, and a first variable capacitor tuning network connected between the first port and the fourth port, and a second variable capacitor tuning network connected between the second port and the third port, a quad hybrid controller that controls states of the first variable capacitor tuning network and the second variable capacitor tuning network, and a digital interface coupled to the quad hybrid controller.

In an embodiment, the first and second capacitors are coupled in series between the first port and the fourth port, with a first intermediate node between the first and second capacitors, the third and fourth capacitors are coupled in series between the second port and the third port, with a second intermediate node between the third and fourth capacitors, the first inductor is coupled between the first port and the second port, the second inductor is coupled between the first intermediate node and the second intermediate node, and the third inductor is coupled between the fourth port and the third port.

In an embodiment, the first variable capacitor tuning network includes a first capacitor and a first switch, and the second variable capacitor tuning network includes a second capacitor and a second switch.

In an embodiment, the first variable capacitor tuning network includes a first non-linear reactance component, and the second variable capacitor tuning network includes a second non-linear reactance component.

A method for operating a quadrature hybrid is also disclosed. The method involves controlling a capacitance value of a first variable capacitor tuning network, which includes a first capacitor, to tune a coupling factor of the quadrature hybrid, and controlling a capacitance value of a second variable capacitor tuning network, which includes a second capacitor, to tune the coupling factor of the quadrature hybrid.

In an embodiment, the first variable capacitor tuning network includes a first switch connected in parallel with the first capacitor, and controlling the capacitance value of the first variable capacitor tuning network comprises controlling the first switch, and the second variable capacitor tuning network includes a second switch connected in parallel with the second capacitor, and controlling the capacitance value of the second variable capacitor tuning network comprises controlling the second switch.

In an embodiment, the first variable capacitor tuning network includes a first switch connected in series with the first capacitor, and controlling the capacitance value of the first variable capacitor tuning network comprises controlling the first switch, and the second variable capacitor tuning network includes a second switch connected in series with the second capacitor, and controlling the capacitance value of the second variable capacitor tuning network comprises controlling the second switch.

In an embodiment, the first variable capacitor tuning network includes a first non-linear reactance component with a first variable capacitance value that is controlled with a first bias voltage, and controlling the first variable capacitance value of the first non-linear reactance component comprises providing the first bias voltage, and the second variable capacitor tuning network includes a second non-linear reactance component with a second variable capacitance value that is controlled with a second bias voltage, and controlling the second variable capacitance value of the second non-linear reactance component comprises providing the second bias voltage.

Other aspects in accordance with the invention will become apparent from the following detailed description, taken in conjunction with the accompanying drawings, illustrated by way of example of the principles of the invention.

BRIEF DESCRIPTION OF THE DRAWINGS

Throughout the description, similar reference numbers may be used to identify similar elements.

DETAILED DESCRIPTION

Figure 1:
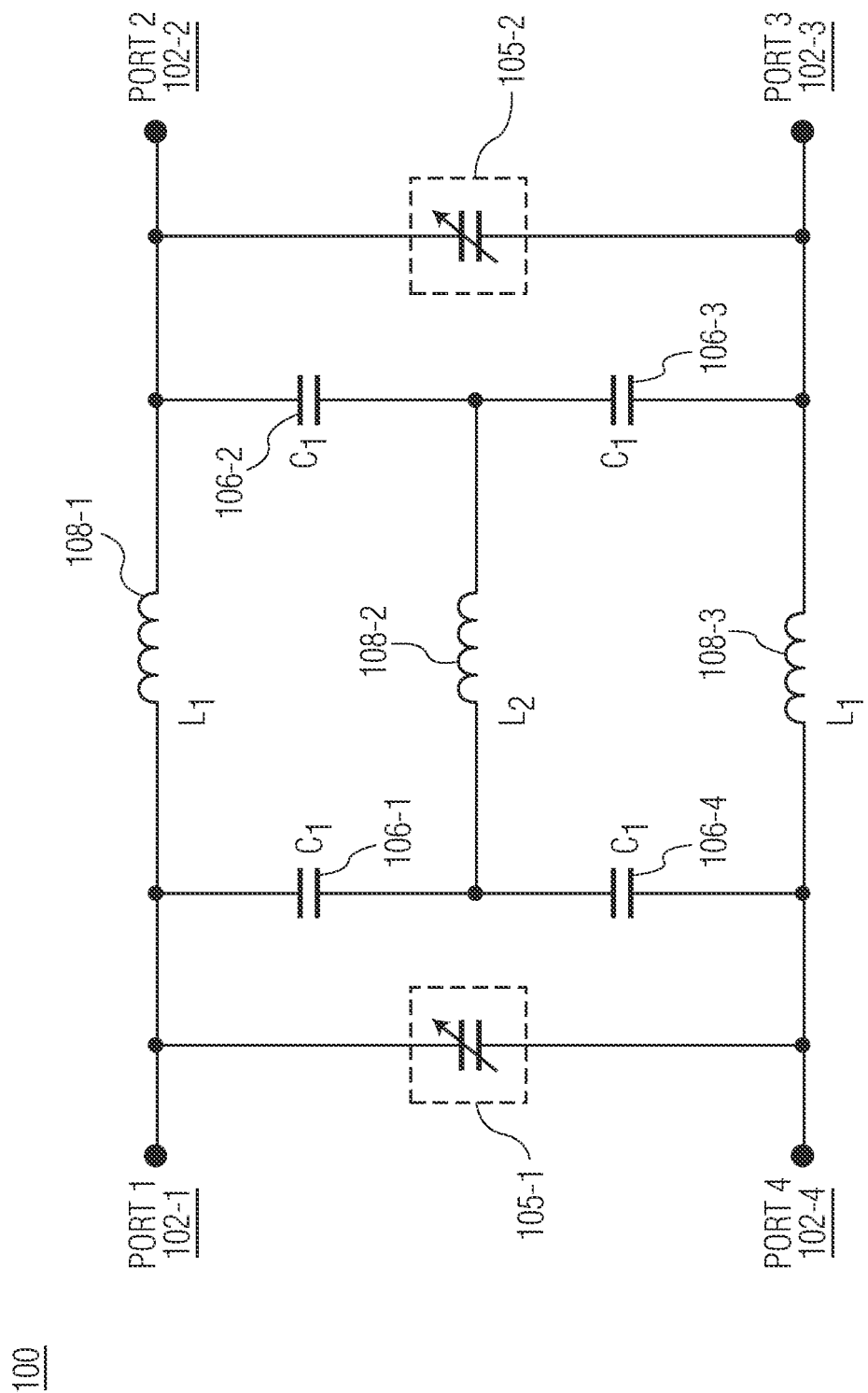
FIG. 1 depicts an example of a quadrature hybrid with tunable capacitances.

It will be readily understood that the components of the embodiments as generally described herein and illustrated in the appended figures could be arranged and designed in a wide variety of different configurations. Thus, the following more detailed description of various embodiments, as represented in the figures, is not intended to limit the scope of the present disclosure, but is merely representative of various embodiments. While the various aspects of the embodiments are presented in drawings, the drawings are not necessarily drawn to scale unless specifically indicated.

The present invention may be embodied in other specific forms without departing from its spirit or essential characteristics. The described embodiments are to be considered in all respects only as illustrative and not restrictive. The scope of the invention is, therefore, indicated by the appended claims rather than by this detailed description. All changes which come within the meaning and range of equivalency of the claims are to be embraced within their scope.

Reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussions of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize, in light of the description herein, that the invention can be practiced without one or more of the specific features or advantages of a particular embodiment. In other instances, additional features and advantages may be recognized in certain embodiments that may not be present in all embodiments of the invention.

Reference throughout this specification to "one embodiment", "an embodiment", or similar language means that a particular feature, structure, or characteristic described in connection with the indicated embodiment is included in at least one embodiment of the present invention. Thus, the phrases "in one embodiment", "in an embodiment", and similar language throughout this specification may, but do not necessarily, all refer to the same embodiment.

The embodiments described herein are directed to radio frequency (RF) signal couplers. As an example, an RF signal coupler may be a quadrature hybrid, which may sometimes be referred to herein as a "quadrature hybrid coupler", an "RF 90-degree coupler", a "3 dB coupler", a "3 dB 90-degree hybrid", and/or a "90-degree hybrid". In some embodiments, the quadrature hybrid may be implemented in a Power Amplifier (PA) Module (PAM).

In PAMs with quadrature hybrids, for example, an input signal (e.g., an RF input signal) may be provided to a quadrature hybrid via an input port. In such an example, the quadrature hybrid may divide the RF input signal into two RF signals with (near) equal or unequal power, apply a phase shift to one or both of the two RF signals (e.g., to achieve about a 90-degree or other phase difference between the signals), and provide the two RF signals to an output port and to a coupled port. Additionally, quadrature hybrids may include an isolated port, such that the isolated port may not receive power from the RF input signal.

In some embodiments, a quadrature hybrid may include four ports, e.g., a first port (Port 1), a second port (Port 2), a third port (Port 3), and a fourth port (Port 4). In such an embodiment, the first port may be an input port, the second port may be an output port, the third port may be a coupled port, and the fourth port may be an isolated port. However, in some embodiments, the second port, the third port, or the fourth port may serve as the input port and the output port, the coupled port, and the isolated port may correspond to the other ports accordingly. In some embodiments, the quadrature hybrid may also include four fixed-value capacitors (e.g., a first capacitor, a second capacitor, a third capacitor, and a fourth capacitor) and three fixed-value inductors (e.g., a first inductor, a second inductor, and a third inductor). In such an embodiment, the four capacitors may each have a similar capacitance value (e.g., $C_1$), such that "similar capacitance value" may imply that the capacitance value of each capacitor is the same or within a predetermined range (e.g., ±5%). Additionally, in such an embodiment, the first inductor and the third inductor may each have a similar inductance value (e.g., $L_1$) and the second inductor may have another different inductance value (e.g., $L_2$), such that "similar inductance value" may imply that the inductance value of the first inductor and the inductance value of the third inductor are the same or within a predetermined range (e.g., ±5%). In other embodiments, the four capacitors may have different capacitance values, and/or the first and third inductors may have different inductance values.

In some embodiments, the four capacitors may make up capacitive elements and the three inductors may make up inductive elements of the quadrature hybrid. In such an embodiment, the capacitance values of the capacitive elements and the inductance values of the inductive elements, e.g., the capacitance values ($C_1$) and the inductance values ($L_1$ and $L_2$), may determine a coupling factor (K) of the quadrature hybrid. As an example, the coupling factor may be defined as a ratio of input power (at an input port) to coupled power (at a coupled port) and may be between, e.g., 0 decibels (dB) and −3 dB, such that the coupling factor may be defined by:

$$K=10*\log_{10}[p_{coupled}/p_{input}] \quad \text{(equation 1)}$$

where K represents the coupling factor, $p_{coupled}$ represents an amount of power transferred to the coupled port, and $p_{input}$ represents an amount of power transferred from the input port. Conventional quadrature hybrids are limited to a static (e.g., constant) coupling factor because the capacitance values of the capacitors and the inductance values of the inductors do not change. Consequently, changing the coupling factor would involve changing the capacitance values of the capacitive elements and changing the inductance values of the inductive elements by physically replacing the elements included in the quadrature hybrid, which may be an inefficient process.

In accordance with an embodiment of the invention a quadrature hybrid includes a first port, a second port, a third port, a fourth port, a first inductor, a second inductor, and a third inductor, a first capacitor, a second capacitor, a third capacitor, and a fourth capacitor, a first variable capacitor tuning network connected between the first port and the fourth port, and a second variable capacitor tuning network connected between the second port and the third port. In some embodiments, the first variable capacitor tuning network and the second variable capacitor tuning network may be a "switched" capacitor tuning network, thus including a switch (or switches) and a capacitor (or capacitors) connected in series, a switch (or switches) and a capacitor (or capacitors) connected in parallel, or a combination of switches and capacitors connected in series and/or connected in parallel. In other embodiments, the first variable capacitor tuning network and the second variable capacitor tuning network may include one or more non-linear reactance components, such as one or more passively tunable integrated circuits (PTICs), varactor diodes, metal-oxide semiconductor (MOS) capacitors or variable plate micro-electro-mechanical system (MEMS) capacitors. As is described below, when switched capacitor tuning networks are used, a coupling factor of a quadrature hybrid is tuned by controlling the switches of the tuning networks so that the respective capacitors in the switched capacitor tuning networks are either bypassed or charged. By incorporating a first switched capacitor tuning network and a second switched capacitor tuning network into a quadrature hybrid, the coupling factor of the quadrature hybrid can be changed (e.g., tuned, adjusted, etc.) via a digital interface (e.g., a Serial Peripheral Interface (SPI) and controller) coupled to the switches without physically replacing capacitive elements and/or inductive elements. Alternatively, when non-linear reactance components such as PTICs are used, a coupling factor of a quadrature hybrid is tuned by controlling the capacitances of the PTICs. For example, when the first and/or second variable capacitor tuning networks include a PTIC, the PTIC may include a variable capacitor with a barium strontium titanate (BST) dielectric layer, which has a capacitance value that is adjustable based on a bias voltage applied across the PTIC. Control signals received through a digital interface may be converted by a controller to a desired bias voltage, thus establishing a desired capacitance for the PTIC. Examples of quadrature hybrids with variable capacitor tuning networks are described in further detail with reference to FIGS. 1-6.

FIG. 1 depicts an example of a quadrature hybrid 100 with tunable capacitances in accordance with an embodiment of the invention. In the embodiment of FIG. 1, the quadrature hybrid 100 includes four ports, implemented as a first port, Port 1 102-1, a second port, Port 2 102-2, a third port, Port 3 102-3, and a fourth port, Port 4 102-4. In an embodiment, Port 1 102-1 may be an input port, such that the input port may receive an RF input signal having an input power, and may transfer portions of the RF input signal to Port 2 102-2 and to Port 3 102-3. In an embodiment, Port 2 102-2 may be an output port, such that the output port may receive at least a portion of the input power transferred from the input port (Port 1 102-1). In an embodiment, Port 3 102-3 may be a coupled port, such that the coupled port may receive coupled power via the input power transferred from the input port (Port 1 102-1). Additionally, in such an embodiment, Port 4 102-4 may be an isolated port, such that the isolated port may not receive power transferred from the input port (Port 1 102-1).

In an embodiment, the quadrature hybrid 100 includes four capacitors, implemented as a first capacitor 106-1, a second capacitor 106-2, a third capacitor 106-3, and a fourth capacitor 106-4. In an embodiment, the four capacitors may each have a similar capacitance value of $C_1$. In other embodiments, the capacitance values of the four capacitors may be different from each other. The quadrature hybrid 100 also includes three inductors, implemented as a first inductor 108-1, a second inductor 108-2, and a third inductor 108-3. In an embodiment, the first inductor 108-1 and the third inductor 108-3 may each have a similar inductance value of $L_1$, and the second inductor may have another inductance value of $L_2$. In other embodiments, the first inductor 108-1 and the third inductor 108-3 may have different inductance values.

The first and second capacitors 106-1, 106-2 are coupled in series between the first port 102-1 and the fourth port 102-4, with a first intermediate node between the first and second capacitors. The third and fourth capacitors 106-3, 106-4 are coupled in series between the second port 102-2 and the third port 102-3, with a second intermediate node between the third and fourth capacitors. The first inductor 108-1 is coupled between the first port 102-1 and the second port 102-2. The second inductor 108-2 is coupled between the first intermediate node and the second intermediate node. The third inductor 108-3 is coupled between the fourth port 102-4 and the third port 102-3.

In accordance with an embodiment of the invention, the quadrature hybrid 100 also includes two variable capacitor tuning networks, implemented as a first variable capacitor tuning network 105-1 and a second variable capacitor tuning network 105-2. In an embodiment, the first variable capacitor tuning network 105-1 is connected between the first port (Port 1 102-1) and the fourth port (Port 4 102-4) and the second variable capacitor tuning network 105-2 is connected between the second port (Port 2 102-2) and the third port (Port 3 102-3).

In an embodiment, the four capacitors, the three inductors, and the two variable capacitor tuning networks may each have corresponding characteristics that determine the coupling factor (K) of the quadrature hybrid 100. In an embodiment, the capacitance values and inductance values of $C_1$, $L_1$, and $L_2$, respectively, remain unchanged while the first and/or the second variable capacitor tuning networks are controlled to change (e.g., tune or adjust) the coupling factor of the quadrature hybrid. In other words, capacitors 106-1, 106-2, 106-3, 106-4 are fixed-value capacitors, and inductors 108-1, 108-2, 108-3 are fixed-value inductors, and the first and second variable capacitor tuning networks 105-1, 105-2 essentially correspond to variable capacitors.

Figure 2A:
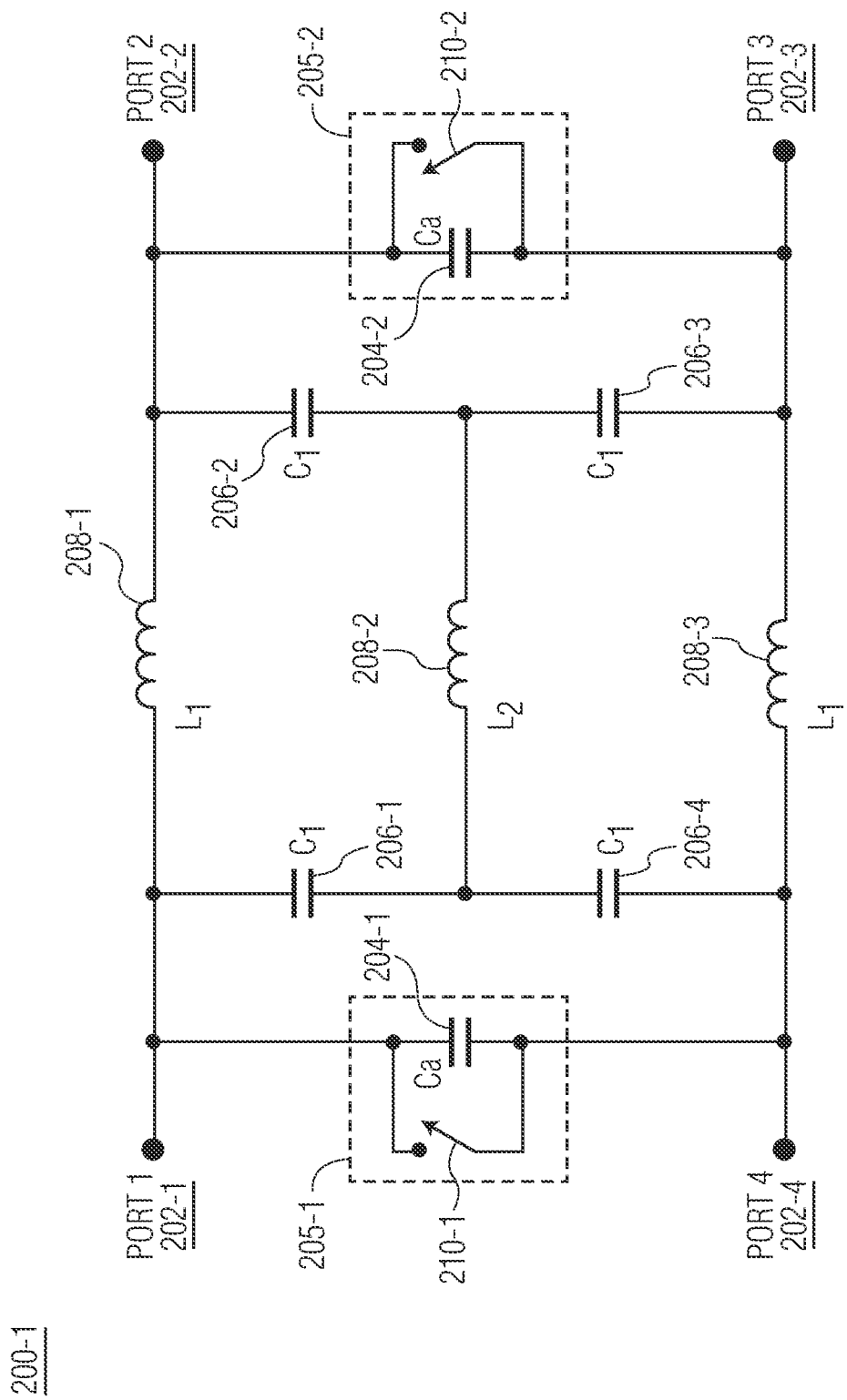
FIG. 2A depicts an example of a quadrature hybrid with capacitors and switches connected in parallel.

FIG. 2A depicts an example of a quadrature hybrid 200-1 with capacitors and switches connected in parallel in accordance with an embodiment of the invention. In the embodiment of FIG. 2A, the quadrature hybrid 200-1 includes four ports, a first port, Port 1 202-1, a second port, Port 2 202-2, a third port, Port 3 202-3, and a fourth port, Port 4 202-4, four fixed-value capacitors, a first capacitor 206-1, a second capacitor 206-2, a third capacitor 206-3, and a fourth capacitor 206-4, and three fixed-value inductors, a first inductor 208-1, a second inductor 208-2, and a third inductor 208-3 as described with reference to FIG. 1. In addition, the quadrature hybrid 200-1 includes two variable capacitor tuning networks, implemented as a first variable capacitor tuning network 205-1 and a second variable capacitor tuning network 205-2. The first variable capacitor tuning network 205-1 is connected between the first port (Port 1 202-1) and the fourth port (Port 4 202-4) and includes a first capacitor 204-1 with a capacitance value of $C_a$ and a first switch 210-1 connected in parallel with the first capacitor 204-1. The second variable capacitor tuning network 205-2 is connected between the second port (Port 2 202-2) and the third port (Port 3 202-3) and includes a second capacitor 204-2 with a capacitance value of $C_a$ and a second switch 210-2 connected in parallel with the second capacitor 204-2.

In an embodiment, the first switch 210-1 and/or the second switch 210-2 may be a complementary metal-oxide-semiconductor (CMOS) transistor and may have a minimal effect on performance with a resistance of 1 ohm ($\Omega$) to 2$\Omega$, such that the quadrature hybrid 200-1 may be easily implemented in silicon-based manufacturing processes. In some embodiments, the capacitance values ($C_a$) of the first capacitor 204-1 and the second capacitor 204-2 may be similar (e.g., the same or within a predetermined range of ±5%). In other embodiments, the capacitance values of the first and second capacitors 204-1, 204-2 may be different.

In some embodiments, the first switch 210-1 and the second switch 210-2 are controlled to affect (e.g., tune or adjust) the capacitance of the corresponding variable capacitor tuning network, 205-1 and 205-2, respectively. As an example, if the first switch 210-1 is closed, then the first capacitor 204-1 is bypassed, and if the first switch 210-1 is open, then a voltage is induced across the first capacitor 204-1. Additionally, if the second switch 210-2 is closed, then the second capacitor 204-2 is bypassed, and if the second switch 210-2 is open, then a voltage is induced across the second capacitor 204-2. In such examples, closing and opening the switches (e.g., turning on/off transistors) changes the capacitance of the first variable capacitor tuning network 205-1 and/or the second variable capacitor tuning network 205-2 and therefore changes (e.g., tunes or adjusts) the coupling factor (K) of the quadrature hybrid 200-1.

In operation, the state of the switches is controlled to tune the coupling factor of the quadrature hybrid. In one operating state, neither the first switch 210-1 nor the second switch 210-2 are closed. In another operating state, only the first switch 210-1 is closed (while the second switch 210-2 is open) and in another operating state, only the second switch 210-2 is closed (while the first switch 210-1 is open). In yet another operating state, both the first switch 210-1 and the second switch 210-2 are closed. By opening/closing the first switch 210-1 and/or the second switch 210-2 (e.g., turning on/off transistors), capacitance values of the variable capacitor tuning networks (e.g., the first variable capacitor tuning network 205-1 and/or the second variable capacitor tuning network 205-2) may be changed, such that changing the capacitance values of the variable capacitor tuning networks tunes the coupling factor (K) of the quadrature hybrid 200-1. Although the first variable capacitor tuning network 205-1 and the second variable capacitor tuning network 205-2 are shown as being mirror images of one another, the first variable capacitor tuning network 205-1 and the second variable capacitor tuning network 205-2 are not limited to the arrangement shown in FIG. 2A. In other embodiments, either or both of the first and/or second variable capacitor tuning networks 205-1, 205-2 may be replaced with non-linear reactance components (e.g., PTICs with capacitance values that may be controlled/varied based on bias voltages applied to the PTICs).

Figure 2B:
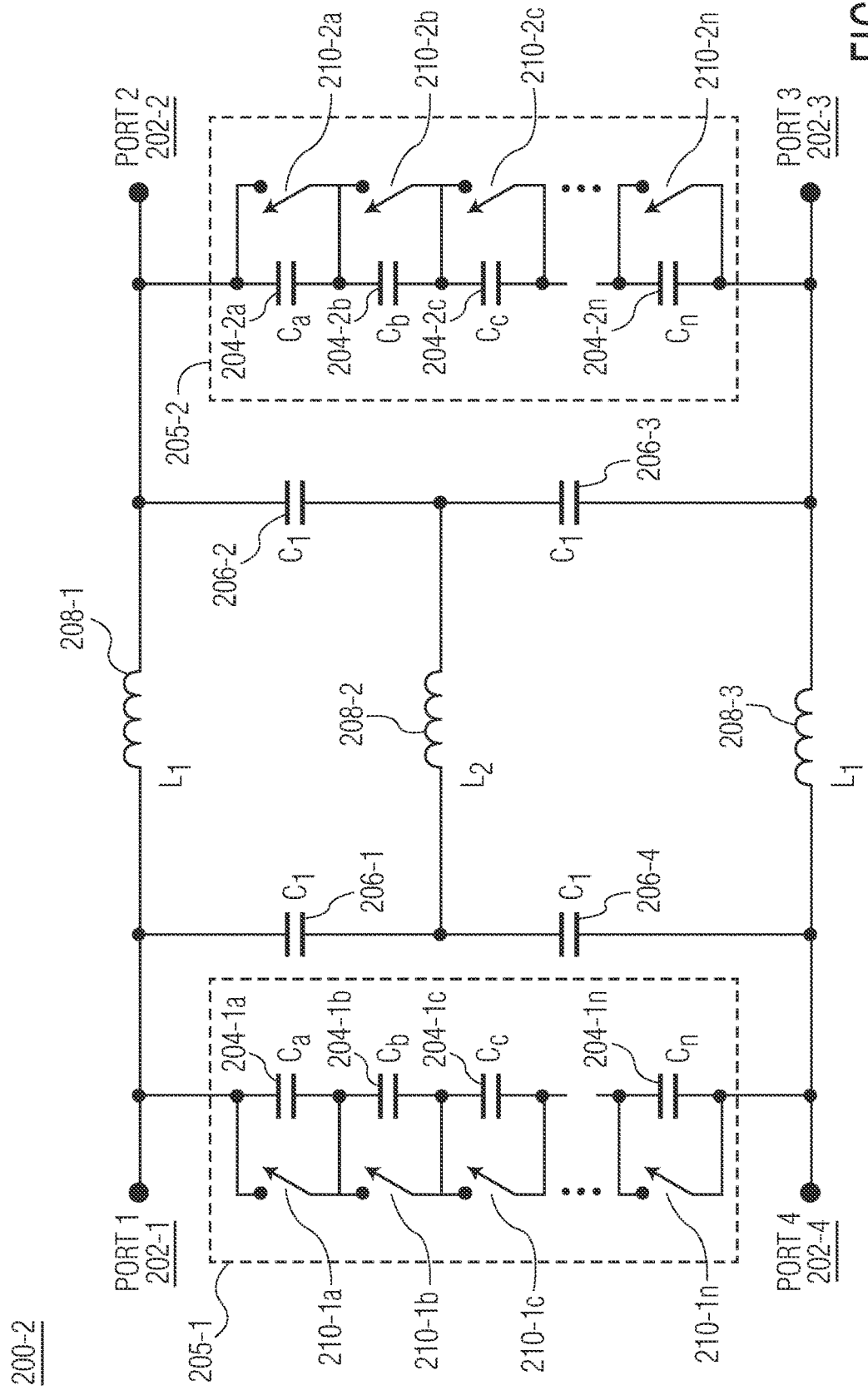
FIG. 2B depicts another example of a quadrature hybrid with capacitors and switches connected in parallel.

FIG. 2B depicts another example of a quadrature hybrid 200-2 with multiple capacitors and switches connected in parallel in accordance with an embodiment of the invention. In the embodiment of FIG. 2B, the quadrature hybrid 200-2 includes four ports, a first port, Port 1 202-1, a second port, Port 2 202-2, a third port, Port 3 202-3, and a fourth port, Port 4 202-4, four capacitors, a first capacitor 206-1, a second capacitor 206-2, a third capacitor 206-3, and a fourth capacitor 206-4, and three inductors, a first inductor 208-1, a second inductor 208-2, and a third inductor 208-3 as described with reference to FIG. 1. In addition, the quadrature hybrid 200-2 includes two variable capacitor tuning networks, implemented as a first variable capacitor tuning network 205-1 connected between the first port (Port 1 202-1) and the fourth port (Port 4 202-4) and a second variable capacitor tuning network 205-2 connected between the second port (Port 2 202-2) and the third port (Port 3 202-3).

The first variable capacitor tuning network 205-1 includes multiple capacitors and switches, implemented as a first capacitor 204-1a with a capacitance value of $C_a$ and a first switch 210-1a connected in parallel with the first capacitor 204-1a, a second capacitor 204-1b with a capacitance value of $C_b$ and a second switch 210-1b connected in parallel with the second capacitor 204-1b, a third capacitor 204-1c with a capacitance value of $C_c$ and a third switch 210-1c connected in parallel with the third capacitor 204-1c, and an $n^{th}$ capacitor 204-1n with a capacitance value of $C_n$ and an $n^{th}$ switch 210-1n connected in parallel with the $n^{th}$ capacitor 204-1n (e.g., n may be an integer greater than one). Likewise, the second variable capacitor tuning network 205-2 includes multiple capacitors and switches, implemented as a first capacitor 204-2a with a capacitance value of $C_a$ and a first switch 210-2a connected in parallel with the first capacitor 204-2a, a second capacitor 204-2b with a capacitance value of $C_b$ and a second switch 210-2b connected in parallel with the second capacitor 204-2b, a third capacitor 204-2c with a capacitance value of $C_c$ and a third switch 210-2c connected in parallel with the third capacitor 204-2c, and an $n^{th}$ capacitor 204-2n with a capacitance value of $C_n$ and an $n^{th}$ switch 210-2n connected in parallel with the $n^{th}$ capacitor 204-2n (e.g., n may be an integer greater than one).

In some embodiments, the capacitance values (e.g., $C_a$, $C_b$, $C_c$, ..., $C_n$) of the first variable capacitor tuning network 205-1 and the second variable capacitor tuning network 205-2 may be similar (e.g., the same or within a predetermined range of ±5%) or the capacitance values (e.g., $C_a$, $C_b$, $C_c$, ..., $C_n$) may be different. That is, different capacitors included in the variable capacitor tuning networks of the quadrature hybrid 200-2 may have the same capacitance value(s) or different capacitance value(s). In one embodiment, there may be an equal number of capacitors and switches included in the first variable capacitor tuning network 205-1 and the second variable capacitor tuning network 205-2, such that each variable capacitor tuning network may have a symmetric arrangement of capacitors and switches. In another embodiment, there may be an unequal number of capacitors and switches (e.g., an asymmetric arrangement of capacitors and switches) included in the first variable capacitor tuning network 205-1 and the second variable capacitor tuning network 205-2, such that one variable capacitor tuning network may have more capacitors and switches or fewer capacitors and switches than the other variable capacitor tuning network. Although the first variable capacitor tuning network 205-1 and the second variable capacitor tuning network 205-2 are shown as being mirror images of one another, the first variable capacitor tuning network 205-1 and the second variable capacitor tuning network 205-2 are not limited to the arrangement shown in FIG. 2B.

In some embodiments, the switches of the first variable capacitor tuning network 205-1 and the second variable capacitor tuning network 205-2 are controlled to affect (e.g., tune or adjust) the capacitance of the corresponding variable capacitor tuning network, 205-1 and 205-2, respectively. For example, if a switch is closed, then a voltage bypasses a capacitor, and if the switch is open, then a voltage may be induced across the capacitor. In such examples, closing and opening the switches (e.g., turning on/off transistors) changes the capacitance(s) of the variable capacitor tuning network(s) and therefore changes the coupling factor (K) of the quadrature hybrid 200-2.

Different combinations of switches (e.g., switches of the first variable capacitor tuning network 205-1 and/or switches of the second variable capacitor tuning network 205-2) may be closed/opened (e.g., turned on/off) to tune the coupling factor (K) of the quadrature hybrid 200-2. By opening/closing different combinations of switches, capacitance values of the variable capacitor tuning networks 205-1 and 205-2 may be changed, such that changing the capacitance values of the variable capacitor tuning networks tunes the coupling factor (K) of the quadrature hybrid. As an example, if each variable capacitor tuning network of a quadrature hybrid includes 10 switches (20 switches total), then there would be a wide range of different combinations in which the switches may be open or closed, and thus a high degree of tunability. In other embodiments, some or all of the capacitors and switches of the first and/or second variable capacitor tuning networks 205-1, 205-2 may be replaced with non-linear reactance components (e.g., PTICs with capacitance values that may be controlled/varied based on bias voltages applied to the PTICs).

Figure 3A:
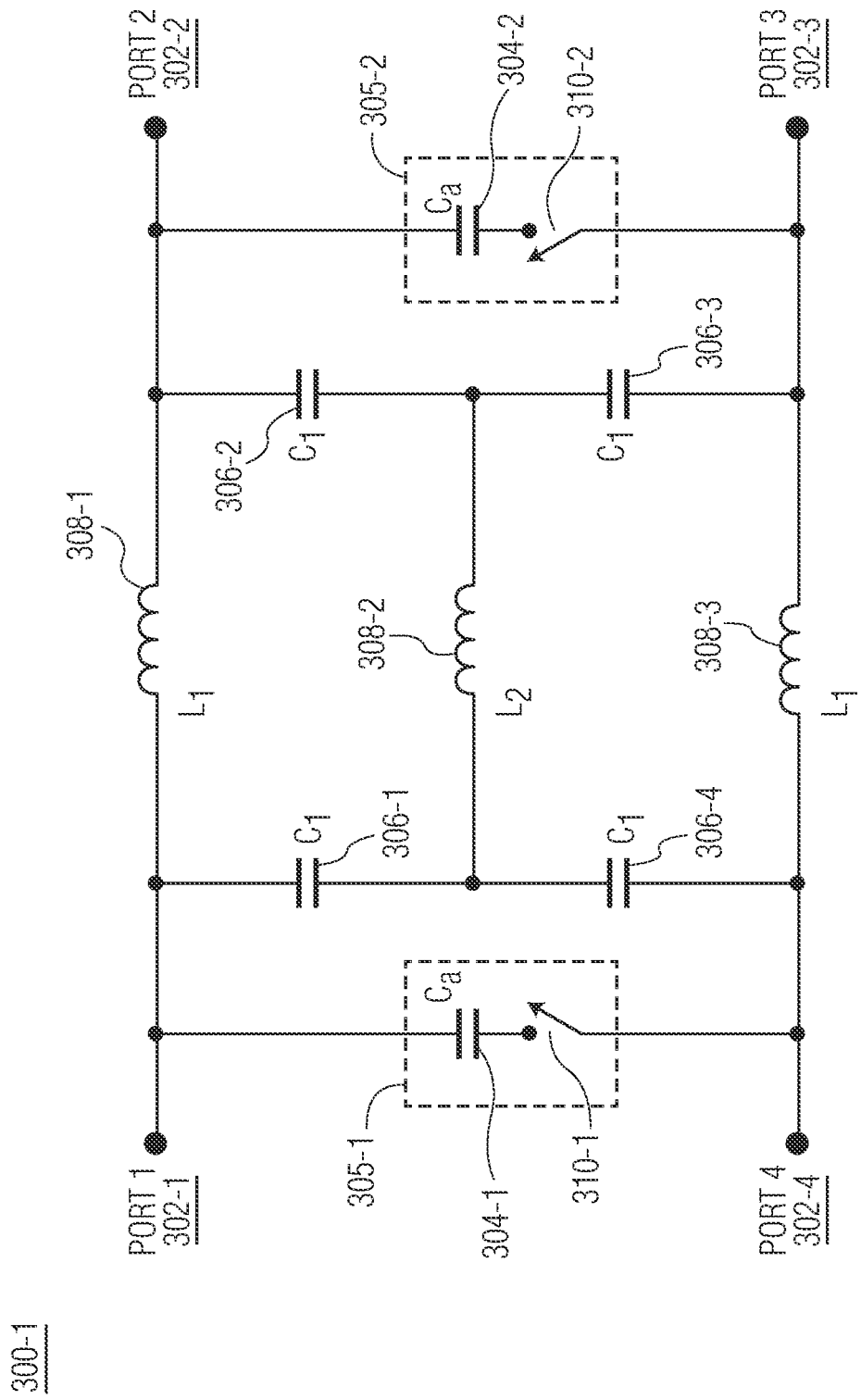
FIG. 3A depicts an example of a quadrature hybrid with capacitors and switches connected in series.

FIG. 3A depicts an example of a quadrature hybrid 300-1 with capacitors and switches connected in series in accordance with an embodiment of the invention. In the embodiment of FIG. 3A, the quadrature hybrid 300-1 includes four ports, a first port, Port 1 302-1, a second port, Port 2 302-2, a third port, Port 3 302-3, and a fourth port, Port 4 302-4, four capacitors, a first capacitor 306-1, a second capacitor 306-2, a third capacitor 306-3, and a fourth capacitor 306-4, and three inductors, a first inductor 308-1, a second inductor 308-2, and a third inductor 308-3 as described with reference to FIG. 1. In addition, the quadrature hybrid 300-1 includes two variable capacitor tuning networks, implemented as a first variable capacitor tuning network 305-1 and a second variable capacitor tuning network 305-2. The first variable capacitor tuning network 305-1 is connected between the first port (Port 1 302-1) and the fourth port (Port 4 302-4) and includes a first capacitor 304-1 with a capacitance value of $C_a$ and a first switch 310-1 connected in series with the first capacitor 304-1. The second variable capacitor tuning network 305-2 is connected between the second port (Port 2 302-2) and the third port (Port 3 302-3) and includes a second capacitor 304-2 with a capacitance value of $C_a$ and a second switch 310-2 connected in series with the second capacitor 304-2.

In an embodiment, the first switch 310-1 and/or the second switch 310-2 may be a CMOS transistor and may have a minimal effect on performance with a resistance of 1Ω to 2Ω, such that the quadrature hybrid 300-1 may be readily implemented in silicon-based manufacturing processes. In some embodiments, the capacitance value ($C_a$) of the first capacitor 304-1 and the second capacitor 304-2 may be similar (e.g., the same or within a predetermined range of ±5%) or may be different.

In some embodiments, the first switch 310-1 and the second switch 310-2 are controlled to affect (e.g., tune or adjust) the capacitance of the corresponding variable capacitor tuning network, 305-1 and 305-2, respectively. As an example, if the first switch 310-1 is closed, then a voltage is induced across the first capacitor 304-1, and if the first switch 310-1 is open, then a voltage is not induced across the first capacitor 304-1. Additionally, if the second switch 310-2 is closed, then a voltage is induced across the second capacitor 304-2, and if the second switch 310-2 is open, then a voltage is not induced across the second capacitor 304-2. In such examples, closing and opening the switches (e.g., turning on/off transistors) changes the capacitance of the first variable capacitor tuning network 305-1 and/or the second variable capacitor tuning network 305-2 and therefore changes the coupling factor (K) of the quadrature hybrid 300-1.

In operation, the state of the switches is controlled to tune the coupling factor of the quadrature hybrid. In one operating state, neither the first switch 310-1 nor the second switch 310-2 are closed. In another operating state, only the first switch 310-1 is closed and in another operating state, only the second switch 310-2 is closed. In yet another operating state, both the first switch 310-1 and the second switch 310-2 are closed. By opening/closing the first switch 310-1 and/or the second switch 310-2 (e.g., turning on/off transistors), capacitance values of the variable capacitor tuning networks (e.g., the first variable capacitor tuning network 305-1 and/or the second variable capacitor tuning network 305-2) may be changed (e.g., adjusted, tuned, etc.), such that changing the capacitance values of the variable capacitor tuning networks tunes the coupling factor (K) of the quadrature hybrid 300-1. Although the first variable capacitor tuning network 305-1 and the second variable capacitor tuning network 305-2 are shown as being mirror images of one another, the first variable capacitor tuning network 305-1 and the second variable capacitor tuning network 305-2 are not limited to the arrangement shown in FIG. 3A. In other embodiments, either or both of the first and/or second variable capacitor tuning networks 305-1, 305-2 may be replaced with non-linear reactance components (e.g., PTICs with capacitance values that may be controlled/varied based on bias voltages applied to the PTICs).

Figure 3B:
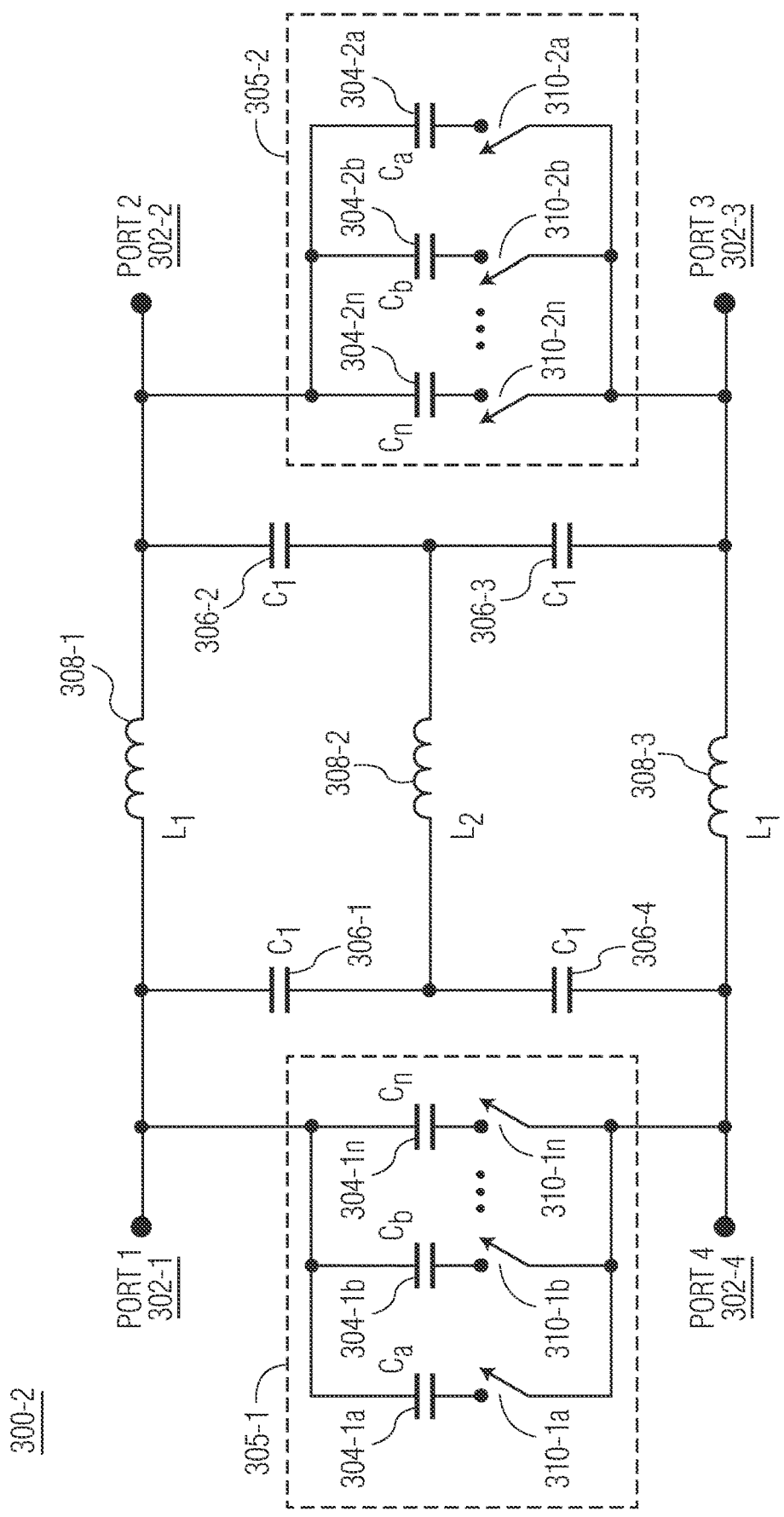
FIG. 3B depicts another example of a quadrature hybrid with capacitors and switches connected in series.

FIG. 3B depicts another example of a quadrature hybrid 300-2 with multiple capacitors and switches connected in series in accordance with an embodiment of the invention. In the embodiment of FIG. 3B, the quadrature hybrid 300-2 includes four ports, a first port, Port 1 302-1, a second port, Port 2 302-2, a third port, Port 3 302-3, and a fourth port, Port 4 302-4, four capacitors, a first capacitor 306-1, a second capacitor 306-2, a third capacitor 306-3, and a fourth capacitor 306-4, and three inductors, a first inductor 308-1, a second inductor 308-2, and a third inductor 308-3 as described with reference to FIG. 1. In addition, the quadrature hybrid 300-2 includes two variable capacitor tuning networks, implemented as a first variable capacitor tuning network 305-1 connected between the first port (Port 1 302-1) and the fourth port (Port 4 302-4) and a second variable capacitor tuning network 305-2 connected between the second port (Port 2 302-2) and the third port (Port 3 302-3).

The first variable capacitor tuning network 305-1 includes multiple capacitors and switches, implemented as a first capacitor 304-1$a$ with a capacitance value of $C_a$ and a first switch 310-1$a$ connected in series with the first capacitor 304-1$a$, a second capacitor 304-1$b$ with a capacitance value of $C_b$ and a second switch 310-1$b$ connected in series with the second capacitor 304-1$b$, and an $n^{th}$ capacitor 304-1$n$ with a capacitance value of $C_n$ and an $n^{th}$ switch 310-1$n$ connected in series with the $n^{th}$ capacitor 304-1$n$ (e.g., n may be an integer greater than one). Likewise, the second variable capacitor tuning network 305-2 includes multiple capacitors and switches, implemented as a first capacitor 304-2$a$ with a capacitance value of $C_a$ and a first switch 310-2$a$ connected in series with the first capacitor 304-2$a$, a second capacitor 304-2$b$ with a capacitance value of $C_b$ and a second switch 310-2$b$ connected in series with the second capacitor 304-2$b$, and an $n^{th}$ capacitor 304-2$n$ with a capacitance value of $C_n$ and an $n^{th}$ switch 310-2$n$ connected in series with the $n^{th}$ capacitor 304-2$n$ (e.g., n may be an integer greater than one).

In some embodiments, the capacitance values (e.g., $C_a$, $C_b$, $C_c$, . . . , $C_n$) of the first variable capacitor tuning network 305-1 and the second variable capacitor tuning network 305-2 may be similar (e.g., the same or within a predetermined range of ±5%) or the capacitance values (e.g., $C_a$, $C_b$, $C_c$, . . . , $C_n$) may be different. That is, different capacitors included in the variable capacitor tuning networks of the quadrature hybrid 300-2 may have the same capacitance value(s) or different capacitance value(s). In one embodiment, there may be an equal number of capacitors and switches included in the first variable capacitor tuning network 305-1 and the second variable capacitor tuning network 305-2, such that each variable capacitor tuning network may have a symmetric arrangement of capacitors and switches. In another embodiment, there may be an unequal number of capacitors and switches (e.g., an asymmetric arrangement of capacitors and switches) included in the first variable capacitor tuning network 305-1 and the second variable capacitor tuning network 305-2, such that one variable capacitor tuning network may have more capacitors and switches or fewer capacitors and switches than the other variable capacitor tuning network. Although the first variable capacitor tuning network 305-1 and the second variable capacitor tuning network 305-2 are shown as being mirror images of one another, the first variable capacitor tuning network 305-1 and the second variable capacitor tuning network 305-2 are not limited to the arrangement shown in FIG. 3B.

In some embodiments, the switches of the first variable capacitor tuning network 305-1 and the second variable capacitor tuning network 305-2 are controlled to affect the capacitance of the corresponding variable capacitor tuning network, 305-1 and 305-2, respectively. For example, if a switch is closed, then a voltage is induced across a capacitor, and if the switch is open, then a voltage is not induced across the capacitor. In such examples, closing and opening the switches (e.g., turning on/off transistors) changes the capacitance(s) of the variable capacitor tuning network(s) and therefore changes the coupling factor (K) of the quadrature hybrid 300-2.

Different combinations of switches (e.g., switches of the first variable capacitor tuning network 305-1 and/or switches of the second variable capacitor tuning network 305-2) may be opened/closed (e.g., turned on/off) to tune the coupling factor (K) of the quadrature hybrid 300-2. By opening/closing different combinations of switches, capacitance values of the variable capacitor tuning networks 305-1 and 305-2 may be changed, such that changing the capacitance values of the variable capacitor tuning networks tunes the coupling factor (K) of the quadrature hybrid. As an example, if each variable capacitor tuning network of a quadrature hybrid includes 10 switches (20 switches total), then there would be a wide range of different combinations in which the switches may be open or closed, and thus a high degree of tunability. In other embodiments, some or all of the capacitors and switches of the first and/or second variable capacitor tuning networks 305-1, 305-2 may be replaced with non-linear reactance components (e.g., PTICs with capacitance values that may be controlled/varied based on bias voltages applied to the PTICs).

Figure 4:
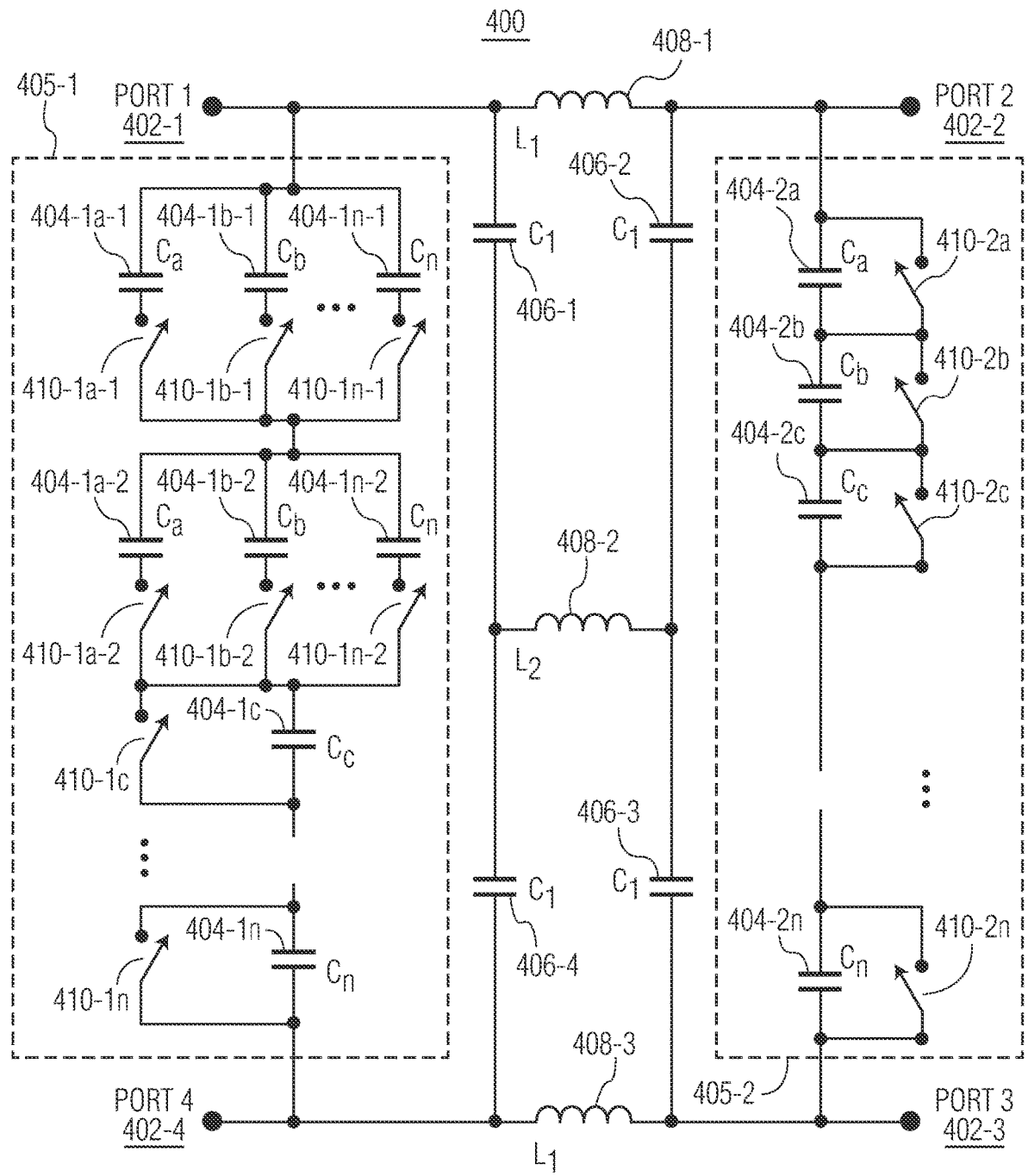
FIG. 4 depicts an example of a quadrature hybrid with capacitors and switches connected in parallel and connected in series.

FIG. 4 depicts an example of a quadrature hybrid 400 with some capacitors and switches connected in parallel, and some capacitors and switches connected in series in accordance with an embodiment of the invention. In the embodiment of FIG. 4, the quadrature hybrid 400 includes four ports, a first port, Port 1 402-1, a second port, Port 2 402-2, a third port, Port 3 402-3, and a fourth port, Port 4 402-4, four capacitors, a first capacitor 406-1, a second capacitor 406-2, a third capacitor 406-3, and a fourth capacitor 406-4, and three inductors, a first inductor 408-1, a second inductor 408-2, and a third inductor 408-3 as described with reference to FIG. 1. In addition, the quadrature hybrid 400 includes two variable capacitor tuning networks, implemented as a first variable capacitor tuning network 405-1 connected between the first port (Port 1 402-1) and the fourth port (Port 4 402-4) and a second variable capacitor tuning network 405-2 connected between the second port (Port 2 402-2) and the third port (Port 3 402-3).

The first variable capacitor tuning network 405-1 includes multiple sets of variable capacitors connected in series with each other. In an embodiment, a first set of variable capacitors includes multiple capacitors and switches, implemented as a first capacitor 404-1$a$-1 with a capacitance value of $C_a$ and a first switch 410-1$a$-1 connected in series with the first capacitor 404-1$a$-1, a second capacitor 404-1$b$-1 with a capacitance value of $C_b$ and a second switch 410-1$b$-1 connected in series with the second capacitor 404-1$b$-1, and an $n^{th}$ capacitor 404-1$n$-1 with a capacitance value of $C_n$ and an n$^{th}$ switch 410-1n-1 connected in series with the n$^{th}$ capacitor 404-1n-1 (e.g., n may be an integer greater than one).

In an embodiment, a second set of variable capacitors includes multiple capacitors and switches, implemented as a first capacitor 404-1a-2 with a capacitance value of C$_a$ and a first switch 410-1a-2 connected in series with the first capacitor 404-1a-2, a second capacitor 404-1b-2 with a capacitance value of C$_b$ and a second switch 410-1b-2 connected in series with the second capacitor 404-1b-2, and an n$^{th}$ capacitor 404-1n-2 with a capacitance value of C$_n$ and an n$^{th}$ switch 410-1n-2 connected in series with the n$^t$ capacitor 404-1n-2 (e.g., n may be an integer greater than one).

In an embodiment, a third set of variable capacitors includes at least one capacitor and switch, implemented as a third capacitor 404-1c with a capacitance value of C$_c$ and a third switch 410-1c connected in parallel with the third capacitor 404-1c, and an n$^{th}$ capacitor 404-1n with a capacitance value of C$_n$ and an n$^{th}$ switch 410-1n connected in parallel with the n$^{th}$ capacitor 404-1n (e.g., n may be an integer greater than one). Although the topology of the first variable capacitor tuning network 405-1 is depicted in FIG. 4 as including a number of switch capacitor sets as well as switches and capacitors connected in series and/or connected in parallel, the first variable capacitor tuning network 405-1 may include any combination and/or number of switch capacitor sets as well as switches and capacitors connected in series and/or connected in parallel.

In an embodiment, the second variable capacitor tuning network 405-2 also includes multiple capacitors and switches, implemented as a first capacitor 404-2a with a capacitance value of C$_a$ and a first switch 410-2a connected in parallel with the first capacitor 404-2a, a second capacitor 404-2b with a capacitance value of C$_b$ and a second switch 410-2b connected in parallel with the second capacitor 404-2b, a third capacitor 404-2c with a capacitance value of C$_c$ and a third switch 410-2c connected in parallel with the third capacitor 404-2c, and an n$^{th}$ capacitor 404-2n with a capacitance value of C$_n$ and an n$^{th}$ switch 410-2n connected in parallel with the n$^{th}$ capacitor 404-2n (e.g., n may be an integer greater than one). Although the topology of the second variable capacitor tuning network 405-2 is depicted in FIG. 4 as including a number of switches and capacitors connected in series, the second variable capacitor tuning network 405-2 may include any combination and/or number of switch capacitor sets as well as switches and capacitors connected in series and/or connected in parallel.

In some embodiments, the capacitance values (e.g., C$_a$, C$_b$, C$_c$, ..., C$_n$) of the first variable capacitor tuning network 405-1 and the second variable capacitor tuning network 405-2 may be similar (e.g., the same or within a predetermined range of ±5%) or the capacitance values (e.g., C$_a$, C$_b$, C$_c$, ..., C$_n$) may be different. In some embodiments, different combinations of switches of the first variable capacitor tuning network 405-1 and of the second variable capacitor tuning network 405-2 may be opened/closed (e.g., turned on/off) to tune the coupling factor (K) of the quadrature hybrid 400. By opening/closing different combinations of switches, capacitance values of the variable capacitor tuning networks 405-1 and/or 405-2 may be changed, such that changing the capacitance values of the variable capacitor tuning networks tunes the coupling factor (K) of the quadrature hybrid 400. In other embodiments, some or all of the capacitors and switches of the first and/or second variable capacitor tuning networks 405-1, 405-2 may be replaced with non-linear reactance components (e.g., PTICs with capacitance values that may be controlled/varied based on bias voltages applied to the PTICs).

Figure 5:
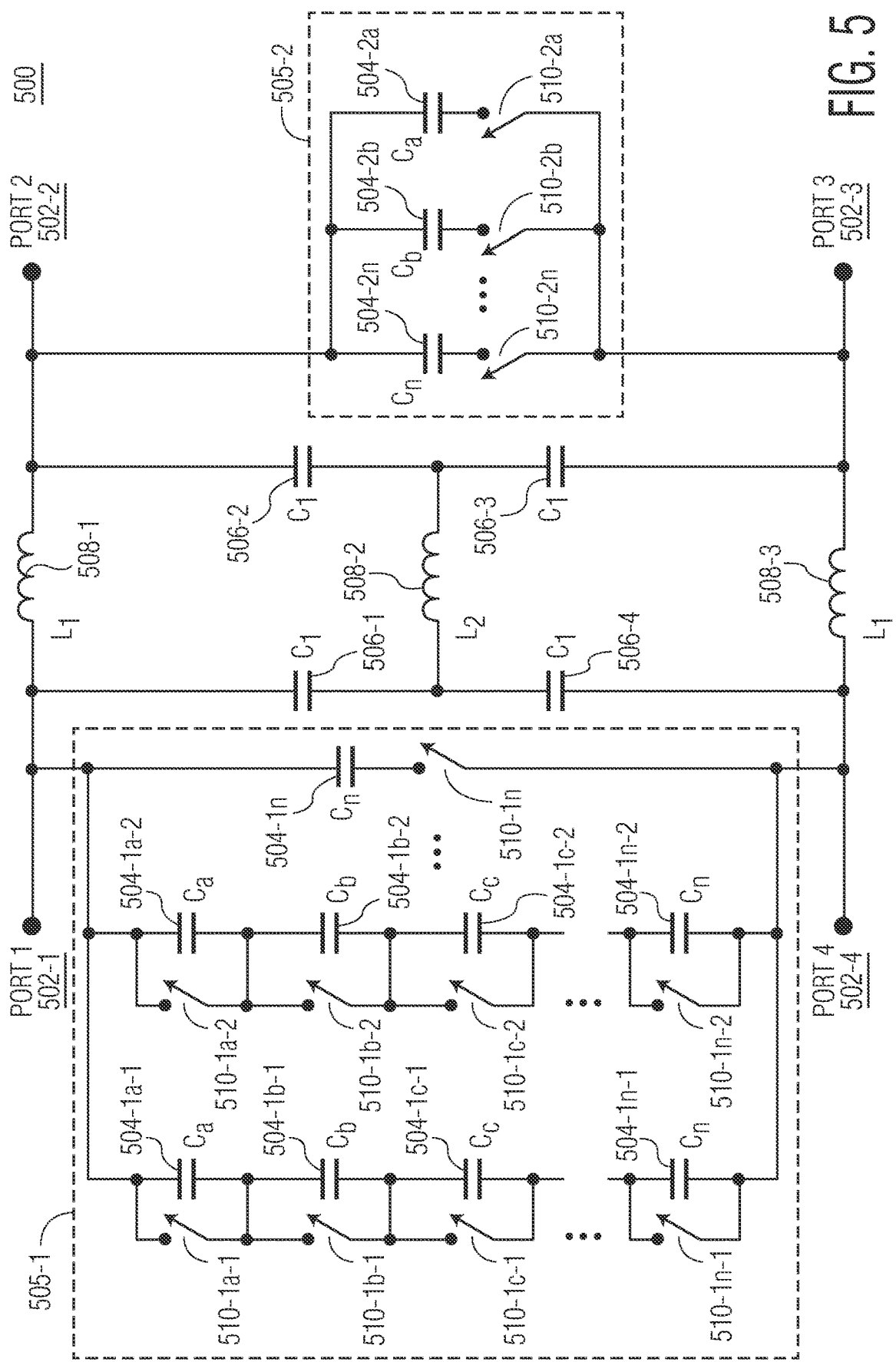
FIG. 5 depicts another example of a quadrature hybrid with capacitors and switches connected in parallel and connected in series.

FIG. 5 depicts another example of a quadrature hybrid 500 with some capacitors and switches connected in parallel, and some capacitors and switches connected in series in accordance with an embodiment of the invention. In the embodiment of FIG. 5, the quadrature hybrid 500 includes four ports, a first port, Port 1 502-1, a second port, Port 2 502-2, a third port, Port 3 502-3, and a fourth port, Port 4 502-4, four capacitors, a first capacitor 506-1, a second capacitor 506-2, a third capacitor 506-3, and a fourth capacitor 506-4, and three inductors, a first inductor 508-1, a second inductor 508-2, and a third inductor 508-3 as described with reference to FIG. 1. In addition, the quadrature hybrid 500 includes two variable capacitor tuning networks, implemented as a first variable capacitor tuning network 505-1 and a second variable capacitor tuning network 505-2. In an embodiment, the first variable capacitor tuning network 505-1 is connected between the first port (Port 1 502-1) and the fourth port (Port 4 502-4), and the second variable capacitor tuning network 505-2 is connected between the second port (Port 2 502-2) and the third port (Port 3 502-3).

The first variable capacitor tuning network 505-1 includes multiple sets of variable capacitors connected in parallel with each other. In an embodiment, a first set of variable capacitors includes multiple capacitors and switches, implemented as a first capacitor 504-1a-1 with a capacitance value of C$_a$ and a first switch 510-1a-1 connected in parallel with the first capacitor 504-1a-1, a second capacitor 504-1b-1 with a capacitance value of C$_b$ and a second switch 510-1b-1 connected in parallel with the second capacitor 504-1b-1, a third capacitor 504-1c-1 with a capacitance value of C$_c$ and a third switch 510-1c-1 connected in parallel with the third capacitor 504-1c-1, and an n$^{th}$ capacitor 504-1n-1 with a capacitance value of C$_n$ and an n$^{th}$ switch 510-1n-1 connected in parallel with the n$^{th}$ capacitor 504-1n-1 (e.g., n may be an integer greater than one).

In an embodiment, a second set of variable capacitors includes multiple capacitors and switches, implemented as a first capacitor 504-1a-2 with a capacitance value of C$_a$ and a first switch 510-1a-2 connected in parallel with the first capacitor 504-1a-2, a second capacitor 504-1b-2 with a capacitance value of C$_b$ and a second switch 510-1b-2 connected in parallel with the second capacitor 504-1b-2, a third capacitor 504-1c-2 with a capacitance value of C$_c$ and a third switch 510-1c-2 connected in parallel with the third capacitor 504-1c-2, and an n$^{th}$ capacitor 504-1n-2 with a capacitance value of C$_n$ and an n$^{th}$ switch 510-1n-2 connected in parallel with the n$^{th}$ capacitor 504-1n-2 (e.g., n may be an integer greater than one).

In an embodiment, the second variable capacitor tuning network 505-2 includes multiple capacitors and switches, implemented as a first capacitor 504-2a with a capacitance value of C$_a$ and a first switch 510-2a connected in series with the first capacitor 504-2a, a second capacitor 504-2b with a capacitance value of C$_b$ and a second switch 510-2b connected in series with the second capacitor 504-2b, and an n$^{th}$ capacitor 504-2n with a capacitance value of C$_n$ and an n$^{th}$ switch 510-2n connected in series with the n$^{th}$ capacitor 504-2n (e.g., n may be an integer greater than one).

Furthermore, although the topology of the variable capacitor tuning networks 505-1 and 505-2 are depicted in FIG. 5 as including a number of switches and capacitors connected in series and a number of switches and capacitors connected in parallel, the variable capacitor tuning networks may include any combination and/or number of switch capacitor sets as well as switches and capacitors connected in series and/or connected in parallel.

In some embodiments, the capacitance values (e.g., $C_a$, $C_b$, $C_c$, ..., $C_n$) of the first variable capacitor tuning network 505-1 and the second variable capacitor tuning network 505-2 may be similar (e.g., the same or within a predetermined range of ±5%) or the capacitance values (e.g., $C_a$, $C_b$, $C_c$, ..., $C_n$) may be different. In some embodiments, different combinations of switches of the first variable capacitor tuning network 505-1 and of the second variable capacitor tuning network 505-2 may be opened/closed to tune the coupling factor (K) of the quadrature hybrid 500. By opening/closing different combinations of switches, capacitance values of the variable capacitor tuning networks 505-1 and/or 505-2 may be changed, such that changing the capacitance values of the variable capacitor tuning networks tunes the coupling factor (K) of the quadrature hybrid 500. In other embodiments, some or all of the capacitors and switches of the first and/or second variable capacitor tuning networks 505-1, 505-2 may be replaced with non-linear reactance components (e.g., PTICs with capacitance values that may be controlled/varied based on bias voltages applied to the PTICs).

Figure 6:
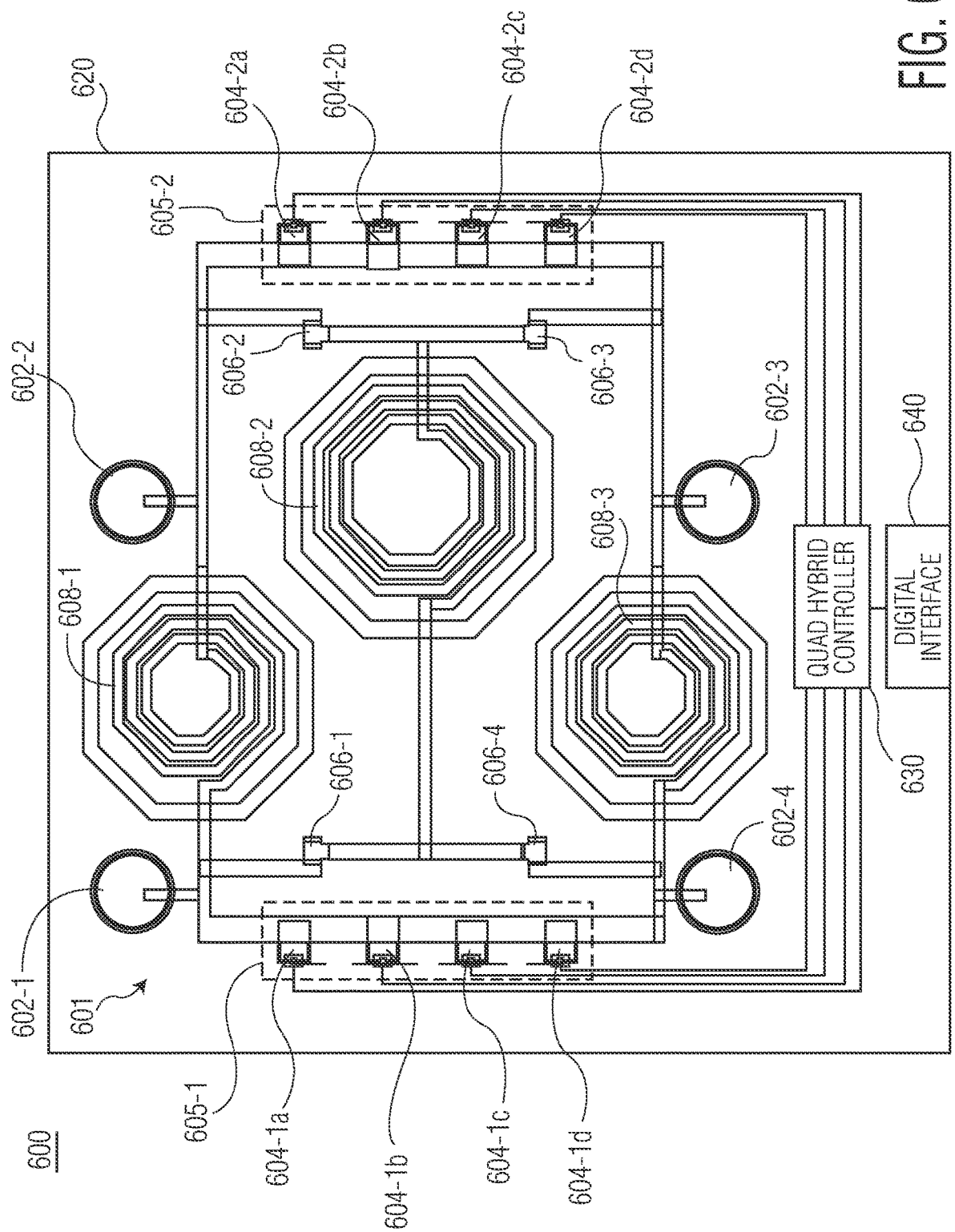
FIG. 6 is an integrated circuit (IC) within which an example of a quadrature hybrid is implemented.

The various quadrature hybrid embodiments discussed above may be implemented on a printed circuit board using discrete components, or may be implemented as a semiconductor-based integrated circuit (IC). For example, FIG. 6 is an IC 600 within which an example of a quadrature hybrid 601 is implemented. The IC 600 includes a semiconductor substrate 620 within which or onto which the various components of the quadrature hybrid 601 are integrated or connected. In various embodiments, the semiconductor substrate 620 may be a silicon (Si) based substrate (e.g., silicon, silicon-germanium (SiGe), silicon-on-insulator, and so on), a III-V based substrate (e.g., gallium-arsenide (GaAs), gallium-nitride (GaN), and so on), or another suitable type of semiconductor substrate.

The quadrature hybrid 601 includes first, second, third, and fourth ports 602-1, 602-2, 602-3, 602-4, which may be implemented as bondpads exposed at the top surface of the semiconductor substrate 620, for example. In addition, the quadrature hybrid 601 includes first, second, third, and fourth fixed-value capacitors 606-1, 606-2, 606-3, and 606-4, each of which may be implemented as an integrated capacitor within the semiconductor substrate 620 (e.g., a metal-insulator-metal capacitor) or a discrete capacitor coupled to the top surface of the semiconductor substrate 620. Through conductive traces or transmission lines of the semiconductor substrate 620, the first and second capacitors 606-1, 606-2 are coupled in series between the first port 602-1 and the fourth port 602-4, with a first intermediate node between the first and second capacitors. Through additional conductive traces or transmission lines of the semiconductor substrate 620, the third and fourth capacitors 606-3, 606-4 are coupled in series between the second port 602-2 and the third port 602-3, with a second intermediate node between the third and fourth capacitors.

The quadrature hybrid 601 also includes first, second, and third fixed-value inductors 608-1, 608-2, 608-3, each of which may be implemented as an integrated spiral inductor on or within the semiconductor substrate 620, as illustrated, or as a discrete inductor coupled to the top surface of the semiconductor substrate 620. Through additional conductive traces or transmission lines of the semiconductor substrate 620, the first inductor 608-1 is coupled between the first port 602-1 and the second port 602-2. Through other additional conductive traces or transmission lines of the semiconductor substrate 620, the second inductor 608-2 is coupled between the first intermediate node and the second intermediate node. Through still other additional conductive traces or transmission lines of the semiconductor substrate 620, the third inductor 608-3 is coupled between the fourth port 602-4 and the third port 602-3.

The quadrature hybrid 601 also includes first and second variable capacitor networks 605-1, 605-2, according to an embodiment. Although the first and second variable capacitor networks 605-1, 605-2 may be in the form of any of the embodiments described in conjunction with FIGS. 1-5, in the illustrated embodiment, the first variable capacitor network 605-1 includes four switched capacitors or non-linear reactance components 604-1a, 604-1b, 604-1c, and 604-1d coupled between the first port 602-1 and the fourth port 602-4, and the second variable capacitor network 605-2 includes four switched capacitors or non-linear reactance components 604-2a, 604-2b, 604-2c, and 604-2d coupled between the second port 602-2 and the third port 602-3. For example, when the non-linear reactance components include PTICs, the PTICs may include a variable capacitor with a BST dielectric layer.

The states of the first and second variable capacitor networks 605-1, 605-2 (and thus the capacitance values of the networks) are controlled through the provision of control signals by a quad hybrid controller 630. For example, the control signals from the quad hybrid controller 630 may include switch control signals (e.g., when the networks include switched capacitors) and/or bias voltages (e.g., when the networks include PTICs). According to an embodiment, the quad hybrid controller 630 is coupled to a digital interface 640 (e.g., a SPI or other type of interface), in order to receive higher-level control signals and/or data from outside circuitry (e.g., an RF front end processor or other circuitry).

As described above, each of the variable capacitors 604-1a, 604-1b, 604-1c, 604-1d, 604-2a, 604-2b, 604-2c, and 604-2d may include a capacitor in series or parallel with a transistor (e.g., a FET), or may include a non-linear reactance component (e.g., a PTIC with a capacitance value that may be controlled/varied based on a bias voltage applied to the PTIC). In the former case, the capacitors 604-1a, 604-1b, 604-1c, 604-1d, 604-2a, 604-2b, 604-2c, and 604-2d may be switched into or out of each network based on control signals provided by the quad hybrid controller 630. In the latter case, the capacitance values of the non-linear reactance components 604-1a, 604-1b, 604-1c, 604-1d, 604-2a, 604-2b, 604-2c, and 604-2d may be controlled by bias signals provided by the quad hybrid controller 630.

Figure 7:
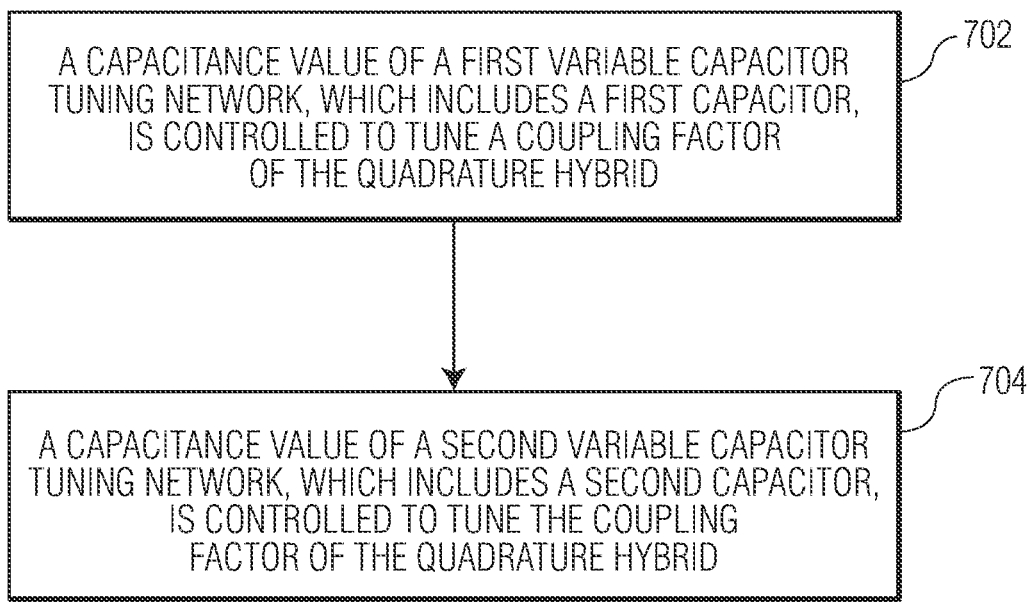
FIG. 7 is a flowchart of a method for operating a quadrature hybrid.

FIG. 7 is a flowchart of a method for operating a quadrature hybrid in accordance with various embodiments of the disclosure. At block 702, a capacitance value of a first variable capacitor tuning network, which includes a first capacitor, is controlled to tune a coupling factor of the quadrature hybrid. At block 704, a capacitance value of a second variable capacitor tuning network, which includes a second capacitor, is controlled to tune the coupling factor of the quadrature hybrid.

Although variable capacitor tuning networks have previously been described and shown as including a 1:1 ratio of capacitors to switches, the variable capacitor tuning networks are not limited to the 1:1 ratio of capacitors to switches. For example, one switch may correspond to multiple capacitors or multiple switches may correspond to one capacitor. In addition, in an embodiment, inductive elements (e.g., inductors) and capacitive elements (e.g., capacitors)

included in a quadrature hybrid may be realized with small (e.g., 0.02"×0.01") discrete components.

The preceding detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, or detailed description.

The connecting lines shown in the various figures contained herein are intended to represent exemplary functional relationships and/or physical couplings between the various elements. It should be noted that many alternative or additional functional relationships or physical connections may be present in an embodiment of the subject matter. In addition, certain terminology may also be used herein for the purpose of reference only, and thus are not intended to be limiting, and the terms "first", "second" and other such numerical terms referring to structures do not imply a sequence or order unless clearly indicated by the context.

The foregoing description refers to elements or features being "connected" or "coupled" together. As used herein, unless expressly stated otherwise, "connected" means that one element is directly joined to (or directly communicates with) another element, and not necessarily mechanically. Likewise, unless expressly stated otherwise, "coupled" means that one element is directly or indirectly joined to (or directly or indirectly communicates with, electrically or otherwise) another element, and not necessarily mechanically. Thus, although the schematic shown in the figures depict one exemplary arrangement of elements, additional intervening elements, devices, features, or components may be present in an embodiment of the depicted subject matter.

Although specific embodiments of the invention have been described and illustrated, the invention is not to be limited to the specific forms or arrangements of parts so described and illustrated. The scope of the invention is to be defined by the claims appended hereto and their equivalents.

What is claimed is:

1. A quadrature hybrid comprising:
   a first port;
   a second port;
   a third port;
   a fourth port;
   first, second, and third inductors;
   first, second, third, and fourth capacitors; and
   a first variable capacitor tuning network connected between the first port and the fourth port;
   a second variable capacitor tuning network connected between the second port and the third port; and
   wherein:
   the first and second capacitors are coupled in series between the first port and the fourth port, with a first intermediate node between the first and second capacitors;
   the third and fourth capacitors are coupled in series between the second port and the third port, with a second intermediate node between the third and fourth capacitors;
   the first inductor is coupled between the first port and the second port;
   the second inductor is coupled between the first intermediate node and the second intermediate node; and
   the third inductor is coupled between the fourth port and the third port.

2. The quadrature hybrid of claim 1, wherein the first variable capacitor tuning network includes a first plurality of capacitors and switches to provide a first tunable capacitance, and the second variable capacitor tuning network includes a second plurality of capacitors and switches to provide a second tunable capacitance.

3. The quadrature hybrid of claim 1, wherein the first variable capacitor tuning network includes a first non-linear reactance component, and the second variable capacitor tuning network includes a second non-linear reactance component.

4. The quadrature hybrid of claim 3, wherein the first non-linear reactance component is controlled with a first bias voltage, and the second non-linear reactance component is controlled with a second bias voltage.

5. The quadrature hybrid of claim 1, wherein the first variable capacitor tuning network includes a first capacitor and a first switch, and the second variable capacitor tuning network includes a second capacitor and a second switch.

6. The quadrature hybrid of claim 5, wherein at least one of the first capacitor and the first switch, and the second capacitor and the second switch are connected in parallel.

7. The quadrature hybrid of claim 5, wherein at least one of the first capacitor and the first switch, and the second capacitor and the second switch are connected in series.

8. The quadrature hybrid of claim 1, wherein the first variable capacitor tuning network includes a first capacitor and a first switch, and the second variable capacitor tuning network includes a second capacitor and a second switch; and
   wherein the first capacitor and the first switch are connected in at least one in series and in parallel, and the second capacitor and the second switch are connected in at least one of in series and in parallel.

9. The quadrature hybrid of claim 1, wherein the first variable capacitor tuning network and the second variable capacitor tuning network have a symmetric arrangement of capacitors and switches.

10. The quadrature hybrid of claim 1, wherein the first variable capacitor tuning network and the second variable capacitor tuning network have an asymmetric arrangement of capacitors and switches.

11. The quadrature hybrid of claim 1, wherein the first variable capacitor tuning network and the second variable capacitor tuning network tune a coupling factor of the quadrature hybrid.

12. An integrated circuit (IC) comprising:
   a quadrature hybrid including:
      a first port;
      a second port;
      a third port;
      a fourth port;
      first, second, and third inductors;
      first, second, third, and fourth capacitors; and
      a first variable capacitor tuning network connected between the first port and the fourth port; and
      a second variable capacitor tuning network connected between the second port and the third port;
   a quad hybrid controller that controls states of the first variable capacitor tuning network and the second variable capacitor tuning network;
   a digital interface coupled to the quad hybrid controller; and wherein:
the first and second capacitors are coupled in series between the first port and the fourth port, with a first intermediate node between the first and second capacitors;
the third and fourth capacitors are coupled in series between the second port and the third port, with a second intermediate node between the third and fourth capacitors;
the first inductor is coupled between the first port and the second port;
the second inductor is coupled between the first intermediate node and the second intermediate node; and
the third inductor is coupled between the fourth port and the third port.

13. The IC of claim 12, wherein the first variable capacitor tuning network includes a first capacitor and a first switch, and the second variable capacitor tuning network includes a second capacitor and a second switch.

14. The IC of claim 12, wherein the first variable capacitor tuning network includes a first non-linear reactance component, and the second variable capacitor tuning network includes a second non-linear reactance component.

15. A method of operating a quadrature hybrid, the method comprising:
controlling a capacitance value of a first variable capacitor tuning network, which includes a first capacitor, to tune a coupling factor of the quadrature hybrid; and
controlling a capacitance value of a second variable capacitor tuning network, which includes a second capacitor, to tune the coupling factor of the quadrature hybrid;

wherein:
the first variable capacitor tuning network includes a first switch connected in a configuration selected from the group consisting of parallel and series with the first capacitor, and controlling the capacitance value of the first variable capacitor tuning network comprises controlling the first switch; and
the second variable capacitor tuning network includes a second switch connected in a configuration selected from the group consisting of parallel and series with the second capacitor, and controlling the capacitance value of the second variable capacitor tuning network comprises controlling the second switch.

16. The method of claim 15, wherein:
the first variable capacitor tuning network includes a first non-linear reactance component with a first variable capacitance value that is controlled with a first bias voltage, and controlling the first variable capacitance value of the first non-linear reactance component comprises providing the first bias voltage; and
the second variable capacitor tuning network includes a second non-linear reactance component with a second variable capacitance value that is controlled with a second bias voltage, and controlling the second variable capacitance value of the second non-linear reactance component comprises providing the second bias voltage.

* * * * *